(12) United States Patent
Fabinski et al.

(10) Patent No.: US 6,870,168 B1
(45) Date of Patent: Mar. 22, 2005

(54) VARYING FEATURE SIZE IN RESIST ACROSS THE CHIP WITHOUT THE ARTIFACT OF "GRID-SNAPPING" FROM THE MASK WRITING TOOL

(75) Inventors: Robert P. Fabinski, Rochester, NY (US); Joseph R. Summa, Hilton, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/706,200

(22) Filed: Nov. 12, 2003

(51) Int. Cl.[7] ............................................... G03F 9/00
(52) U.S. Cl. ...................... 250/491.1; 430/5; 430/296; 324/158 R
(58) Field of Search .................... 250/491.1; 430/5, 430/296; 324/158 R

(56) References Cited

U.S. PATENT DOCUMENTS

| | | |
|---|---|---|
| 4,538,105 A * | 8/1985 | Ausschnitt .................. 324/766 |
| 5,103,101 A | 4/1992 | Berglund et al. |
| 5,773,836 A | 6/1998 | Hartley |
| 5,905,020 A | 5/1999 | Hu et al. |
| 6,278,123 B1 | 8/2001 | Hu et al. |
| 6,331,711 B1 | 12/2001 | Vernon |
| 6,335,151 B1 * | 1/2002 | Ausschnitt et al. ......... 430/322 |
| 2002/0045105 A1 * | 4/2002 | Brown et al. |

* cited by examiner

*Primary Examiner*—John R. Lee
*Assistant Examiner*—Zia R. Hashmi
(74) *Attorney, Agent, or Firm*—Peyton C. Watkins

(57) ABSTRACT

A method for creating a pattern on a substrate, the method includes the steps of imprinting a first pattern on the substrate; and imprinting a second substantially similar pattern which is mis-registered with regard to the first pattern so that the combination of the first and second patterns cause a systematic variation in a final size of defined elements across the substrate.

7 Claims, 2 Drawing Sheets

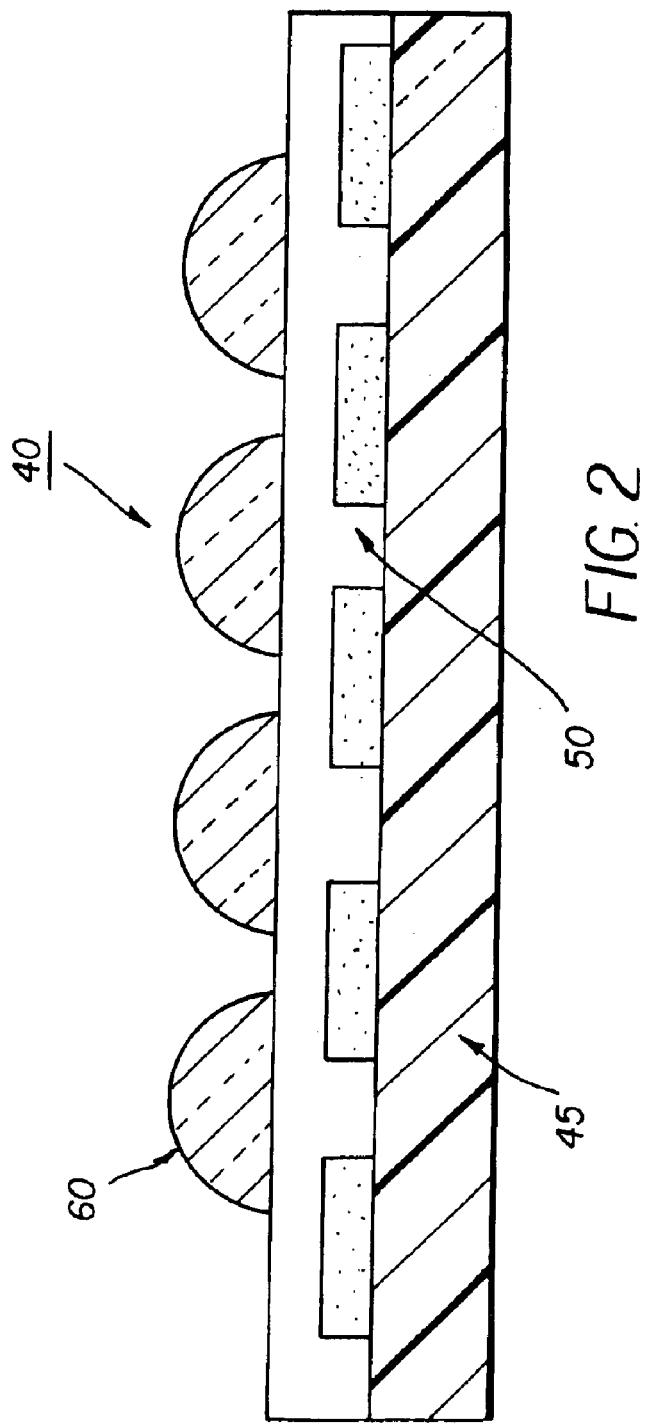
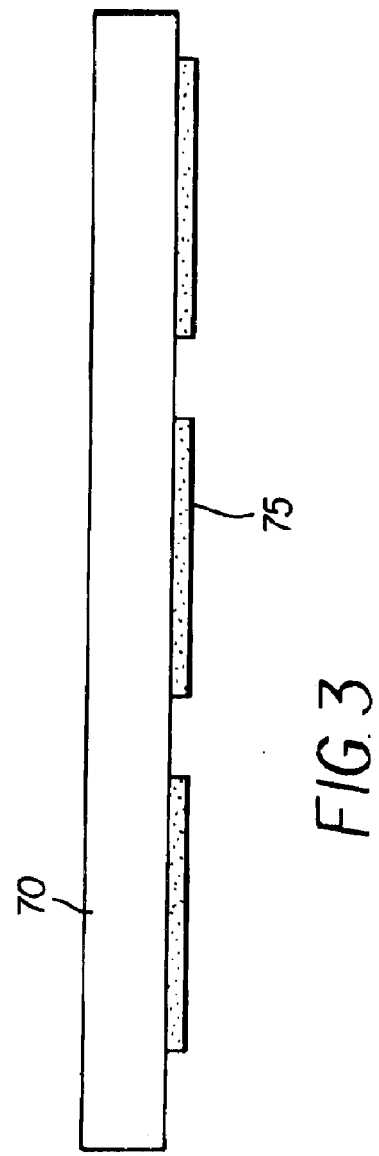

VARYING FEATURE SIZE IN RESIST ACROSS THE CHIP WITHOUT THE ARTIFACT OF "GRID-SNAPPING" FROM THE MASK WRITING TOOL

FIELD OF THE INVENTION

The invention relates generally to the field of image sensors and, more particularly, to apertures for such image sensors having an increasing aperture size as the apertures approach the periphery of the image sensor.

BACKGROUND OF THE INVENTION

Systematic variations in critical dimension feature size of lithographically defined images may sometimes be required to compensate for process variability in the semiconductor industry. Currently, the prior art addresses only the elimination of systematic variation such as U.S. Pat. No. 6,331,711. Such techniques, however, are subject to the limitation of the mask writing tool address grid (spot size) when determining the minimum possible critical dimension difference within a pattern.

Consequently, a need exists for a method which permits a virtually continuous variation of feature size by superimposing two exposures that are identical except for their distortion terms; that is to say magnification, rotation, translation and the like.

SUMMARY OF THE INVENTION

The present invention is directed to overcoming one or more of the problems set forth above. Briefly summarized, according to one aspect of the present invention, the invention resides in a method for creating a pattern on a substrate, the method comprising the step of (a) imprinting a first pattern on the substrate; and (b) imprinting a second substantially similar pattern which is intentionally misregistered with regard to the first pattern so that the combination of the first and second patterns cause a systematic variation in a final size of the defined design elements across the substrate.

These and other aspects, objects, features and advantages of the present invention will be more clearly understood and appreciated from a review of the following detailed description of the preferred embodiments and appended claims, and by reference to the accompanying drawings.

Advantageous Effect of the Invention

The present invention has the following advantages: varying the feature size in resist across the chip without the artifact of grid-snapping from the mask-writing tool; and the incremental difference in feature dimension allowed by this method is so small as to be prohibitive (i.e. very small spot size) with the current mask-writing technology.

BRIEF DESCRIPTION OF THE DRAWINGS

FIG. 2 is a cross section of an image sensor having elements created by the present invention; and FIG. 3 is a cross section of a mask also having elements created by the present invention.

DETAILED DESCRIPTION OF THE INVENTION

Figure 1:
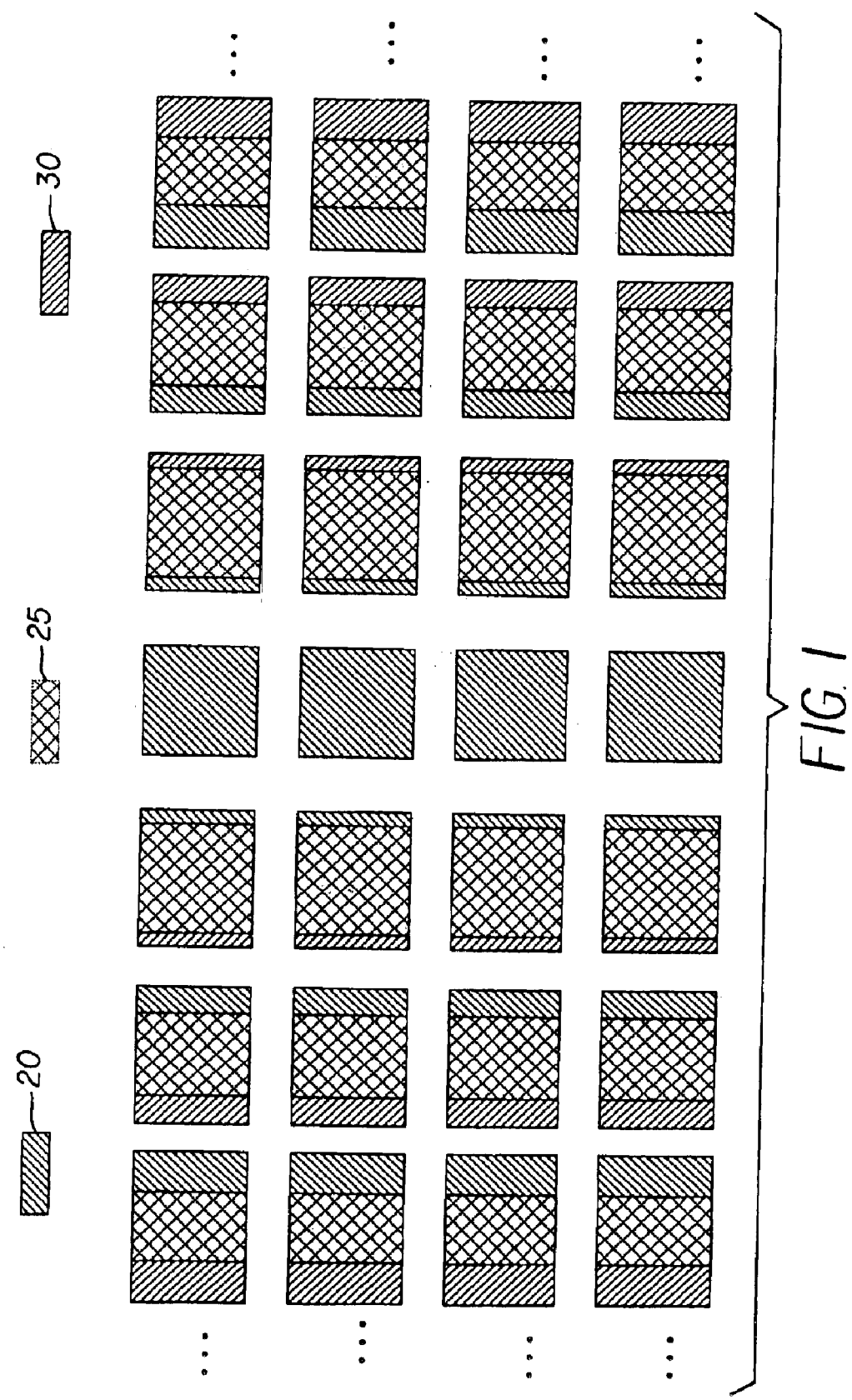
FIG. 1 is a top view of a pattern of apertures created by the present invention.

Referring to FIG. 1, there is shown a top view of a substrate of the present invention having a predetermined or systematic variation in the sizes of the apertures created across the substrate. It facilitates understanding to note that either mask writing or a stepper (both referred to hereinafter as lithography tool) is used to create the apertures. Such lithography tools are well in the art and will not be described in detail herein. The lithography tool exposes the first pattern 20 of apertures at substantially the same time across the substrate which pattern is shown in FIG. 1. The lithography tool then exposes a second pattern 30 of apertures that are mis-registered (not in exact alignment) with regard to the first pattern. The mis-registration across the substrate is such that the second pattern 30 is scaled or magnified with respect to the first pattern 20. The resulting combination of the first 20 and second 30 pattern is a series of apertures that increase in size across the substrate so that apertures created at the periphery of the substrate are larger than those at the center and therebetween. In the case of the preferred embodiment, a pattern 20 consisting of columns of apertures with a periodicity of 10 microns in the X-axis is represented. The second 30 pattern is 10 parts per million larger than the first pattern. The overlapping area 25 will be exposed twice, so it may be necessary to adjust the energy used to expose the two patterns accordingly. The increase in aperture dimension in adjoining columns is 0.0001 microns, which is more gradual than can be achieved with a single pass image formation.

Although the preferred embodiment shows the increasing dimension in the x-axis, the mis-registration can be comprised of, but not limited to, a combination of magnification (described hereinabove), translation (a shift in either axis direction), and rotation.

Referring to FIG. 2, there is shown an image sensor 40 on a substrate 45 having specific elements, such as, but not limited to, apertures 50 and microlenses 60 created with the above-described method of increasing aperture or microlens size.

Referring to FIG. 3, there is shown a mask 70 with a pattern of apertures 75 also created with the above-described method.

The invention has been described with reference to a preferred embodiment. However, it will be appreciated that variations and modifications can be effected by a person of ordinary skill in the art without departing from the scope of the invention.

Parts List 20 first pattern
25 overlapping areas
30 second pattern
40 image sensor
45 substrate
50 apertures
60 microlenses
70 mask
75 apertures

What is claimed is:

1. A method for creating a pattern on a substrate, the method comprising the step of:
   (a) imprinting a first pattern on the substrate; and
   (b) imprinting a second substantially similar pattern that is intentionally mis-registered in a pre-defined manner with regard to the first pattern so that the combination of the first and second patterns causes continuous, systematic and pre-defined variations in final sizes of defined elements across the substrate consistent with the predefined misregistration so that at least two or more of the defined elements have different dimensions.

2. The method as in claim 1, wherein step (b) includes providing the elements as structures used for an image sensor.

3. The method as in claim 2, wherein step (b) includes providing the element as an aperture.

4. The method as in claim 1, wherein step (b) includes providing the element as a micro-lens.

5. The method as in claim 1, wherein step (b) includes providing a mask as the substrate, which mask is used as a template for device fabrication.

6. The method as in claim 1, wherein step (b) includes providing a material upon which the device is fabricated as the substrate.

7. The method as in claim 3, wherein step (b) includes systematically increasing aperture size as the aperture approaches a periphery of the substrate.

* * * * *